(12) United States Patent
Schaller et al.

(10) Patent No.: US 12,399,153 B2
(45) Date of Patent: Aug. 26, 2025

(54) PHOTOACOUSTIC SENSORS AND MEMS DEVICES

(71) Applicant: Infineon Technologies AG, Neubiberg (DE)

(72) Inventors: Rainer Markus Schaller, Saal a.d. Donau (DE); Jochen Dangelmaier, Beratzhausen (DE); Matthias Eberl, Taufkirchen (DE); Simon Gassner, Munich (DE); Franz Jost, Stuttgart (DE); Stefan Kolb, Unterschleissheim (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 369 days.

(21) Appl. No.: 18/069,371

(22) Filed: Dec. 21, 2022

(65) Prior Publication Data

US 2023/0116926 A1   Apr. 20, 2023

Related U.S. Application Data

(62) Division of application No. 17/116,029, filed on Dec. 9, 2020, now Pat. No. 11,573,204.

(30) Foreign Application Priority Data

Dec. 13, 2019  (DE) .......................... 102019134279.1

(51) Int. Cl.
*G01N 29/02*   (2006.01)
*B81B 3/00*   (2006.01)

(52) U.S. Cl.
CPC ........... *G01N 29/02* (2013.01); *B81B 3/0018* (2013.01); *B81B 2201/0292* (2013.01); *G01N 2291/021* (2013.01)

(58) Field of Classification Search
CPC ............. G01N 29/02; G01N 2291/021; G01N 2021/0112; G01N 2021/1704; G01N 21/1702; B81B 3/0018; B81B 2201/0292
See application file for complete search history.

(56) References Cited

U.S. PATENT DOCUMENTS 4,657,397 A * 4/1987 Oehler ................ G02B 6/4298
                                                     250/353
6,344,647 B1   2/2002 Jourdain et al.
(Continued)

FOREIGN PATENT DOCUMENTS

DE   102014114672 A1   4/2015
DE   102016205024 A1   9/2016
(Continued)

*Primary Examiner* — David J Bolduc
(74) *Attorney, Agent, or Firm* — Harrity & Harrity, LLP

(57) ABSTRACT

A photoacoustic sensor includes a first MEMS device and a second MEMS device. The first MEMS device includes a first MEMS component including an optical emitter, and a first optically transparent cover wafer-bonded to the first MEMS component, wherein the first MEMS component and the first optically transparent cover form a first closed cavity. The second MEMS device includes a second MEMS component including a pressure detector, and a second optically transparent cover wafer-bonded to the second MEMS component, wherein the second MEMS component and the second optically transparent cover form a second closed cavity.

20 Claims, 9 Drawing Sheets

(56) References Cited

U.S. PATENT DOCUMENTS

| | | | |
|---|---|---|---|
| 8,415,626 B1* | 4/2013 | Wong | G01J 5/022 250/343 |
| 9,513,261 B2 | 12/2016 | Dehe et al. | |
| 10,241,088 B2 | 3/2019 | Theuss et al. | |
| 10,451,543 B2 | 10/2019 | Mueller et al. | |
| 10,451,589 B2 | 10/2019 | Tumpold et al. | |
| 2002/0194897 A1* | 12/2002 | Arnott | G01N 29/2462 73/23.31 |
| 2008/0252891 A1* | 10/2008 | Uber | G01N 21/1702 73/24.02 |
| 2010/0317939 A1* | 12/2010 | Kuhn | A61B 5/14552 600/323 |
| 2015/0101395 A1* | 4/2015 | Dehe | G01N 29/30 73/24.02 |
| 2015/0204822 A1 | 7/2015 | Horan et al. | |
| 2015/0377775 A1* | 12/2015 | Sakai | G01N 21/0303 250/338.1 |
| 2016/0282259 A1 | 9/2016 | Kolb et al. | |
| 2016/0313288 A1* | 10/2016 | Theuss | G01N 29/2425 |
| 2017/0067859 A1 | 3/2017 | Kolb et al. | |
| 2017/0212036 A1* | 7/2017 | Mueller | G01N 33/0009 |
| 2017/0290097 A1 | 10/2017 | Pindl et al. | |
| 2017/0325013 A1 | 11/2017 | Dehe et al. | |
| 2018/0146512 A1 | 5/2018 | Pindl et al. | |
| 2019/0120797 A1 | 4/2019 | Tumpold et al. | |
| 2019/0132661 A1 | 5/2019 | Dehe et al. | |
| 2019/0246459 A1 | 8/2019 | Tumpold et al. | |
| 2019/0331531 A1 | 10/2019 | Glacer et al. | |
| 2019/0352175 A1 | 11/2019 | Tumpold et al. | |
| 2019/0376889 A1 | 12/2019 | Takei et al. | |
| 2020/0057031 A1 | 2/2020 | Theuss et al. | |
| 2020/0150095 A1 | 5/2020 | Schaller et al. | |
| 2020/0249149 A1 | 8/2020 | Theuss | |
| 2020/0309678 A1 | 10/2020 | Tumpold | |
| 2020/0355602 A1 | 11/2020 | Kolb et al. | |
| 2020/0400553 A1 | 12/2020 | Manz et al. | |
| 2021/0055207 A1 | 2/2021 | Mittereder et al. | |
| 2021/0181151 A1 | 6/2021 | Schaller et al. | |
| 2021/0349057 A1 | 11/2021 | Tumpold | |

FOREIGN PATENT DOCUMENTS

| | | |
|---|---|---|
| DE | 102015106373 A1 | 10/2016 |
| DE | 102016103646 A1 | 7/2017 |
| DE | 102017109821 A1 | 11/2017 |
| DE | 102017112197 A1 | 12/2017 |

* cited by examiner

PHOTOACOUSTIC SENSORS AND MEMS DEVICES

RELATED APPLICATION

This application is a divisional of U.S. patent application Ser. No. 17/116,029, filed Dec. 9, 2020, which claims priority to Germany Application No. 102019134279.1, filed Dec. 13, 2019, which are incorporated herein by reference in their entirety.

FIELD

The present disclosure relates to photoacoustic sensors and MEMS devices.

BACKGROUND

Photoacoustic sensors can detect specific gas species in the ambient air, for example. In particular, harmful or hazardous components in the ambient air can be detected in this case. The correct functioning of such sensors can thus be of extremely high importance in many applications, particularly if the sensors are intended to guarantee the safety of work personnel. Photoacoustic sensors can be constructed from a plurality of components, in particular MEMS devices. Manufacturers of photoacoustic sensors and MEMS devices constantly endeavor to improve their products. In particular, it may be desirable in this case to provide cost-effective photoacoustic sensors having an improved design. Furthermore, it may be desirable to provide improved methods for producing such apparatuses.

SUMMARY

Various aspects relate to a photoacoustic sensor. The photoacoustic sensor includes a first MEMS device and a second MEMS device. The first MEMS device includes a first MEMS component including an optical emitter, and a first optically transparent cover wafer-bonded to the first MEMS component, wherein the first MEMS component and the first optically transparent cover form a first closed cavity. The second MEMS device includes a second MEMS component including a pressure detector, and a second optically transparent cover wafer-bonded to the second MEMS component, wherein the second MEMS component and the second optically transparent cover form a second closed cavity.

Various aspects relate to a MEMS device. The MEMS device includes a MEMS component and a cover secured to the MEMS component, wherein the MEMS component and the cover form a closed cavity. The MEMS device furthermore includes an optical opening, which provides an optical access to the cavity and to an optical path extending within the cavity. A movable part of the MEMS component is arranged outside the course of the optical path.

BRIEF DESCRIPTION OF THE DRAWINGS

Photoacoustic sensors and MEMS devices in accordance with the disclosure are explained in greater detail below with reference to drawings. The elements shown in the drawings are not necessarily rendered in a manner true to scale relative to one another. Identical reference signs may designate identical components.

DETAILED DESCRIPTION

The figures described below show photoacoustic sensors and MEMS devices in accordance with the disclosure. In this case, the described apparatuses may be illustrated in a general way in order to describe aspects of the disclosure qualitatively. The apparatuses described may have further aspects that may not be illustrated in the respective figure for the sake of simplicity. However, the respective example may be extended by aspects described in association with other examples in accordance with the disclosure. Consequently, explanations concerning a specific figure may equally apply to examples of other figures.

Figure 1:
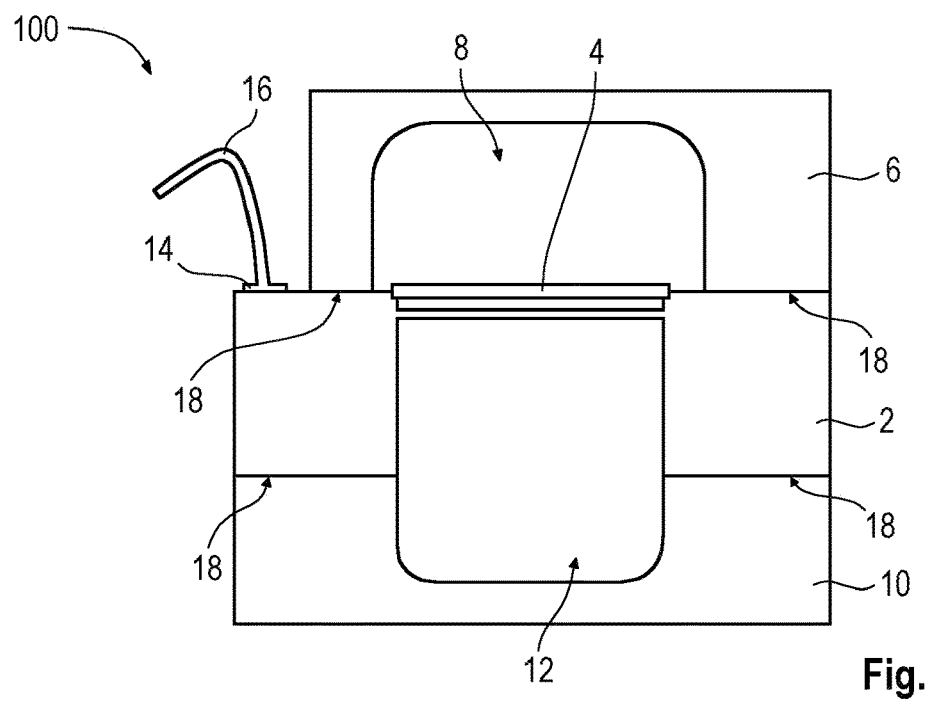
FIG. 1 schematically illustrates a cross-sectional side view of a MEMS device 100 in accordance with the disclosure.
Figure 2:
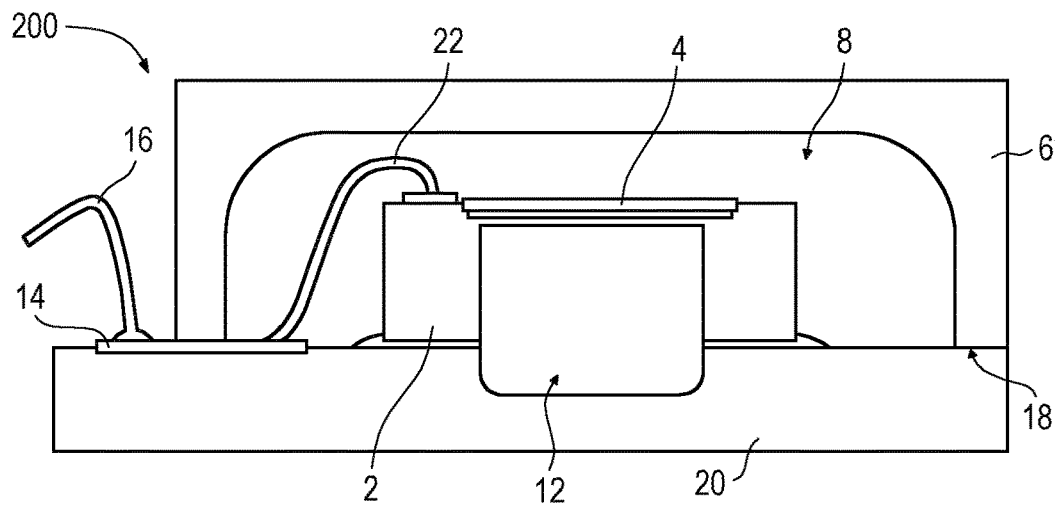
FIG. 2 schematically illustrates a cross-sectional side view of a MEMS device 200 in accordance with the disclosure.

FIGS. 1 and 2 show unpackaged MEMS devices 100 and 200. The MEMS devices 100 and 200 described can each form a photoacoustic emitter unit or a photoacoustic detector unit. A photoacoustic sensor, for example, can thus be constructed from the MEMS devices 100 and 200.

The MEMS device 100 in FIG. 1 can comprise a MEMS component 2 having one or more movable structures (MEMS structures 4). The MEMS component 2 can be a MEMS chip, which can be fabricated from a semiconductor material such as silicon, for example. In one example, the MEMS component 2 can comprise a pressure detector. The pressure detectors specified in this description can be, for example, microphones or any other type of pressure sensors or pressure-sensitive sensors. In this case, the MEMS device 100 can form for example a photoacoustic detector unit of a photoacoustic sensor. In a further example, the MEMS component 2 can comprise an emitter of optical radiation, wherein the movable structure 4 can form a heating membrane, for example. In this case, the MEMS device 100 can form for example a photoacoustic emitter unit of a photoacoustic sensor.

The MEMS device 100 can comprise an optically transparent cover 6, which can be secured to the top side of the MEMS component 2. In this case, the MEMS component 2 and the optically transparent cover 6 can be wafer-bonded, in particular, that is to say that a connection of the two components may have been carried out at the wafer level. The optically transparent cover 6 can be fabricated for example from a glass material, a semiconductor material, or a ceramic material. The MEMS component 2 and the optically transparent cover 6 can form a first closed cavity 8. Depending on the application of the MEMS device 100, a protective gas or a reference gas can be enclosed in the cavity 8. The protective gases specified in this description can be for example nitrogen or a noble gas, such as e.g. argon, xenon, krypton. The reference gases specified in this description can be for example carbon dioxide, nitrogen oxide, methane, ammonia.

The MEMS device 100 can comprise a cover 10, which can be secured to the underside of the MEMS component 2. In this case, the MEMS component 2 and the cover 10 can be wafer-bonded, in particular, that is to say that a connection of the two components may have been carried out at the wafer level. The cover 10 can be optically transparent. By way of example, the cover 10 can be fabricated from a glass material, a semiconductor material, or a ceramic material. The MEMS component 2 and the cover 10 can form a further closed cavity 12. Depending on the application of the MEMS device 100, a protective gas or a reference gas can be enclosed in the cavity 12.

The MEMS component 2 can comprise an electrical connection 14, which can be electrically contacted by way of an electrical connection element 16 such as a bond wire, for example. The MEMS component 2 can be electrically connected to external components (not illustrated) by way of the electrical connection 14 and the electrical connection element 16. If the MEMS device 100 forms a photoacoustic detector unit, for example, signals detected by the movable structure 4 can be transmitted to an external component in this way. If the MEMS device 100 forms a photoacoustic emitter unit, for example, the optical radiation emitted by the movable structure 4 can be controlled by an external component in this way.

The covers 6 and 10 can each be wafer-bonded to the MEMS component 2. The connections between the respective components can thus be present in the form of so-called wafer bonds 18. Different wafer bonding techniques can be used here depending on the material of the respective cover 6 or 10 and the MEMS component 2. One example can involve wafer bonding without the use of an intermediate layer. This can involve in particular direct bonding or anodic bonding. A further example can involve wafer bonding using an intermediate layer. This can involve in particular glass frit bonding, soldering, eutectic bonding, thermocompression bonding, or adhesive bonding.

During the production of the MEMS device 100, the parts thereof can be connected at the wafer level. That is to say at least one of the components 2, 6 and 10 can initially be present in the form of a wafer during the production of the MEMS device 100. By way of example, the cover 6 can initially be part of a glass wafer that can comprise any desired number of further covers. The wafers can be connected to one another using one of the wafer bonding techniques mentioned above. The bonded wafers can subsequently be singulated into a plurality of MEMS devices 100. Production of the MEMS device 100 at the wafer level using the wafer bonding techniques described above may be more cost-effective in comparison with other production methods.

The MEMS device 200 in FIG. 2 can be at least partly similar to the MEMS device 100 in FIG. 1. Explanations concerning FIG. 1 can thus also be applicable to the MEMS device 200. The MEMS device 200 can comprise a carrier 20, on which the MEMS component 2 can be arranged. By way of example, the carrier 20 can be a semiconductor substrate, in particular a silicon substrate. The MEMS component 2 can be secured to the carrier 20 for example by an adhesive or a DDAF (Dicing Die Attach Film). A cavity 12 can be formed between the underside of the movable structure 4 and the top side of the carrier 20.

Furthermore, the MEMS device 200 can comprise an optically transparent cover 6, which can be secured to the top side of the carrier 20. In this case, the optically transparent cover 6 and the carrier 20 can be wafer-bonded, in particular, such that a connection between these components can be present in the form of a wafer bond 18. The optically transparent cover 6 and the carrier 20 can form a cavity 8, in which the MEMS component 2 can be arranged. In the example in FIG. 2, the carrier 20 can be embodied as substantially planar. In further examples, the carrier 20, in particular that part of the carrier 20 which is arranged below the cover 6, can have a depression. The depression can be formed in the shape of a trough, for example. The MEMS component 2 can be arranged in the depression, such that the movable part 4 can be at a deeper level and/or the height of the cavity 8 can be increased in comparison with FIG. 2. The MEMS component 2 can be electrically connected, by way of an electrical connection element 22, to an electrical connection 14 arranged on the carrier 20 and to a further electrical connection element 16. Being electrically connected in this way enables the MEMS component 2 to transmit or receive electrical signals to or from external components.

FIGS. 3 to 9 show packaged MEMS devices 300 to 900. The MEMS devices 300 to 900 described can each form a photoacoustic emitter unit or a photoacoustic detector unit. A photoacoustic sensor, for example, can thus be constructed from the MEMS devices 300 to 900. FIGS. 3 to 9 show in particular possibilities for packaging the MEMS devices 100 and 200 from FIGS. 1 and 2. In this case, the examples shown in FIGS. 3 to 9 are based on the MEMS device 100 from FIG. 1. Further examples with the same construction can be based on the MEMS device 200 from FIG. 2.

Figure 3:
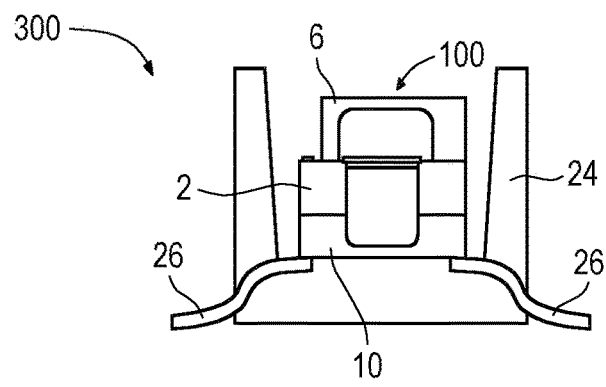
FIG. 3 schematically illustrates a cross-sectional side view of a packaged MEMS device 300 in accordance with the disclosure.

The MEMS device 300 in FIG. 3 can comprise a package in the form of a shell or trough 24. In one example, the shell 24 can be fabricated from a mold compound. The mold compounds specified in this description can comprise at least one from an epoxy, a filled epoxy, a glass-fiber-filled epoxy, an imide, a thermoplastic, a thermosetting polymer, a polymer mixture. An unpackaged MEMS device 100 can be arranged on a base surface of the shell 24. The MEMS device 100 can optionally additionally be embedded into an encapsulation material such as, for example, a glob top material (not illustrated). The packaged MEMS device 300 can furthermore comprise one or more connecting conductors 26. The connecting conductors 26 can extend through the walls of the shell 24 and provide an electrical connection between the MEMS component 2 and components (not illustrated) arranged outside the shell 24.

Figure 4:
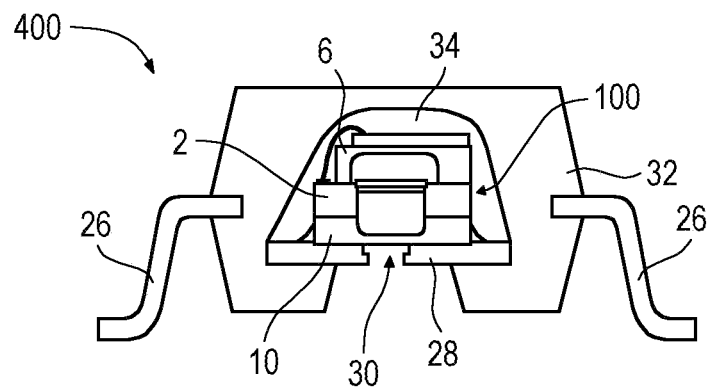
FIG. 4 schematically illustrates a cross-sectional side view of a packaged MEMS device 400 in accordance with the disclosure.

The packaged MEMS device 400 in FIG. 4 can comprise a carrier 28, which can be for example a die pad of a leadframe. An unpackaged MEMS device 100 can be arranged on the carrier 28. An opening 30 can be formed in the carrier 28, through which opening the MEMS device 100 can emit and/or receive optical radiation. The MEMS device 100 can be at least partly encapsulated in an encapsulation material 32, which can be fabricated from a mold compound, in particular. Within the encapsulation material 32, the unpackaged MEMS device 100 can be optionally additionally embedded in a further encapsulation material 34 such as, for example, a glob top material.

The packaged MEMS device 400 can comprise one or more connecting conductors 26, which can project at least partly from the encapsulation material 32. The connecting conductors 26 can be for example leads or pins of a leadframe. The MEMS component 2 can be electrically contacted from outside the encapsulation material 32 by way of the connecting conductors 26. An electrical connection between the MEMS component 2 and the connecting conductors 26 is not illustrated in FIG. 4 for the sake of simplicity.

Figure 5:
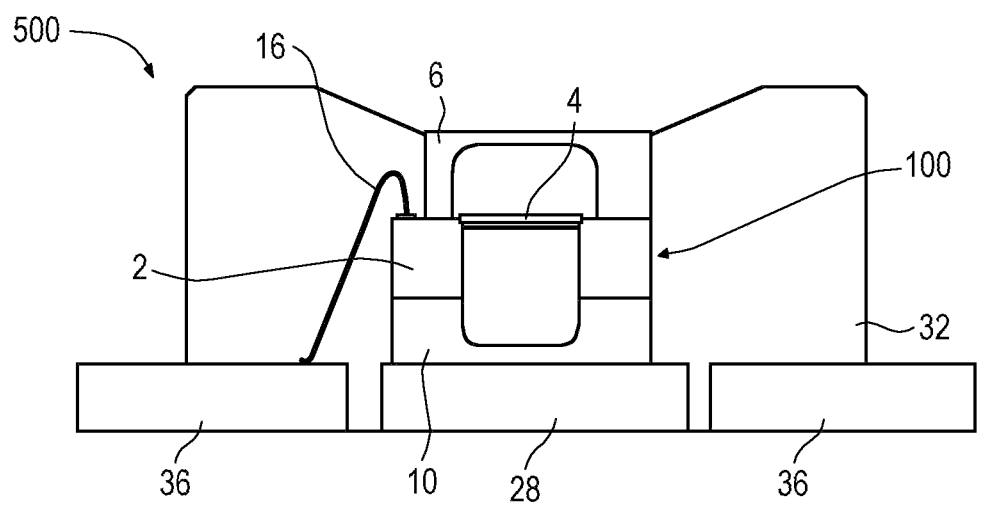
FIG. 5 schematically illustrates a cross-sectional side view of a packaged MEMS device 500 in accordance with the disclosure.

The packaged MEMS device 500 in FIG. 5 can comprise a carrier 28 and electrical connections 36, which can be arranged in an identical plane. In this case, in particular the top sides and undersides of the carrier 28 and of the connections 36 can be arranged in each case in a coplanar fashion. The carrier 28 and the electrical connections 36 can be for example parts of an identical leadframe. A MEMS device 100 can be arranged on the carrier 28, which MEMS device can be at least partly encapsulated in an encapsulation material 32. The encapsulation material 32 can be fabricated from a mold compound, in particular. In the example in FIG. 5, the encapsulation material 32 can cover the side surfaces of the MEMS device 100. The top side of the MEMS device 100 can remain free of the encapsulation material 32, such that optical radiation can be emitted and/or received by the MEMS device 100. The encapsulation material 32 can cover the carrier 28 and the electrical connections 36 and can also be arranged in the interspaces of these components. An underside of the encapsulation material 32 and undersides of the carrier 28 and of the electrical connections 36 can be arranged in one plane, i.e. can be embodied in a coplanar fashion.

Figure 6:
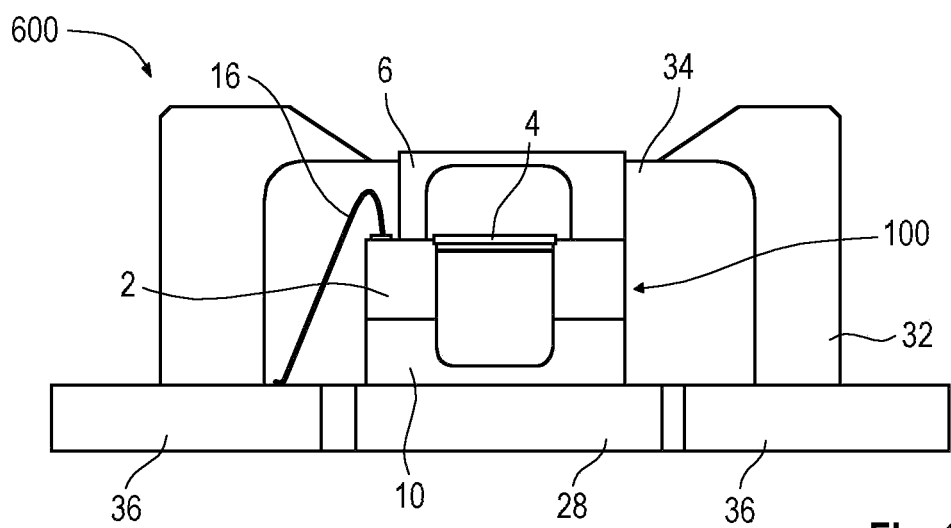
FIG. 6 schematically illustrates a cross-sectional side view of a packaged MEMS device 600 in accordance with the disclosure.

The packaged MEMS device 600 in FIG. 6 can be at least partly similar to the MEMS device 500 in FIG. 5. In contrast to FIG. 5, the MEMS device 600 in FIG. 6 can comprise a further encapsulation material 34, which can be at least partly covered by the encapsulation material 32. The further encapsulation material can be a glob top material, for example. The MEMS device 100 can be embedded in the further encapsulation material 34, wherein a top side of the MEMS device 100 can remain free of the further encapsulation material 34 in order to enable optical radiation to be exchanged between the MEMS device 100 and the surroundings.

Figure 7:
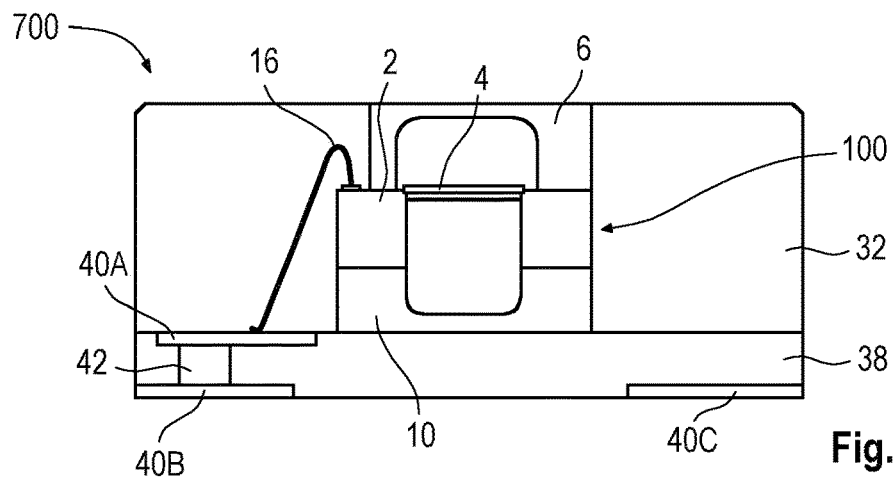
FIG. 7 schematically illustrates a cross-sectional side view of a packaged MEMS device 700 in accordance with the disclosure.

The packaged MEMS device 700 in FIG. 7 can comprise a substrate 38. The substrate 38 can have one or more electrical connections 40A to 40C on its top side and underside. The electrical connections 40A to 40C can be electrically connected to one another by way of a wiring structure 42 arranged within the substrate 38. As a result, electrical signals can be redistributed between electrical connections on an identical side of the substrate 38 or on opposite sides of the substrate 38. The MEMS component 2 can be electrically connected to the electrical connection 40A on the top side of the substrate 38 by way of an electrical connection element 16. The electrical connection 40A can be electrically connected to the electrical connection 40B on the underside of the substrate 38 by way of the wiring structure 42. The MEMS component 100 can thus be contacted from outside the packaged MEMS device 700 by way of the electrical connection 40B. The MEMS component 100 can be at least partly encapsulated in an encapsulation material 32, which can be fabricated from a mold compound, for example. In this case, in particular the top side of the MEMS device 100 can remain free of the encapsulation material 32.

Figure 8:
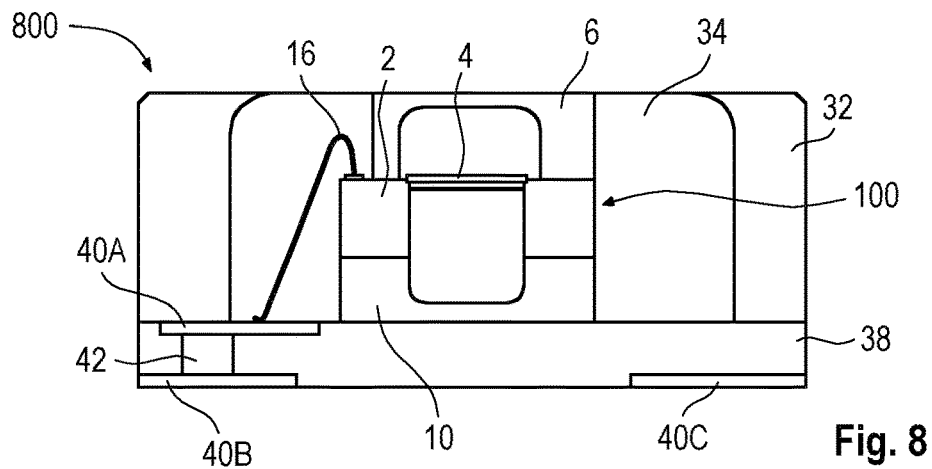
FIG. 8 schematically illustrates a cross-sectional side view of a packaged MEMS device 800 in accordance with the disclosure.

The packaged MEMS device 800 in FIG. 8 can be at least partly similar to the MEMS device 700 in FIG. 7. In contrast to FIG. 7, the MEMS device 800 in FIG. 8 can comprise a further encapsulation material 34, which can be covered by the encapsulation material 32. The further encapsulation material 34 can be a glob top material, for example. The top side of the MEMS device 100 can remain free of both encapsulation materials 32 and 34.

Figure 9:
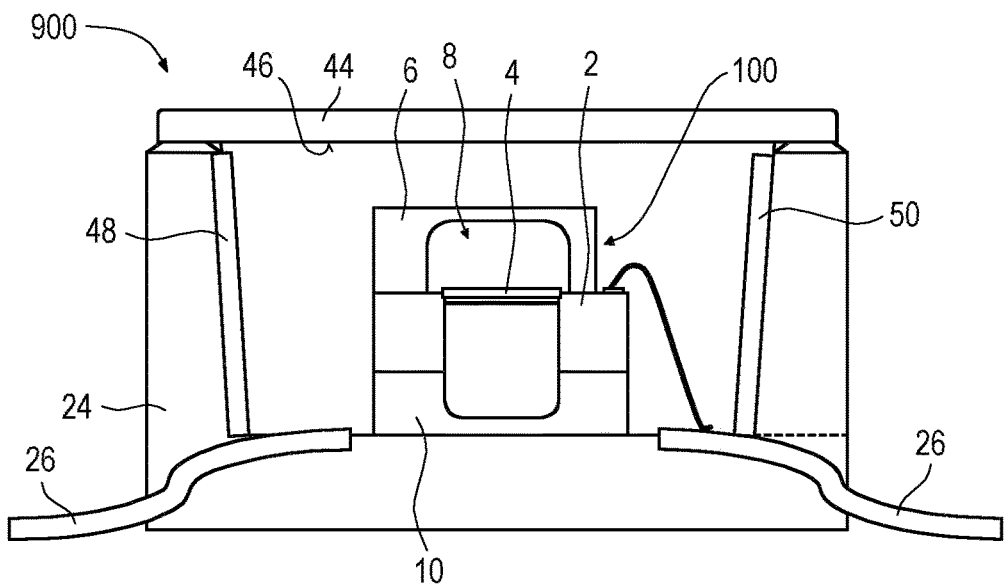
FIG. 9 schematically illustrates a cross-sectional side view of a packaged MEMS device 900 in accordance with the disclosure.

In a manner similar to FIG. 3, the MEMS device 900 in FIG. 9 can comprise a package in the form of a shell 24, a MEMS device 100 arranged therein and connecting conductors 26 extending through the shell 24. An opening on the top side of the shell 24 can be covered by a cover 44 having an optically reflected inner surface 46. The shell 24 and the cover 44 can form a closed cavity. An optically reflective structure 48 can be arranged on the left sidewall of the shell 24, which structure can be realized for example by an optically reflective coating or an optically reflective lamina. An optically transparent window 50 can be formed in the right sidewall of the shell 24.

In one example, the MEMS device 900 can be operated as a photoacoustic emitter unit. Optical radiation generated by the movable structure 4 can be reflected from the inner surface 46 of the cover 44 and/or the structure 48 in such a way that the optical radiation can emerge from the interior of the MEMS device 900 through the window 50. In a further example, the MEMS device 900 can be operated as a photoacoustic detector unit. Optical radiation emitted by an emitter, for example, can enter the interior of the MEMS device 900 through the window 50. The optical radiation can be reflected from the inner surface 46 of the cover 44 and/or the structure 48 in such a way that the optical radiation can enter the cavity 8 of the MEMS device 100. Detailed paths of the optical radiation are not illustrated in FIG. 9 for the sake of simplicity.

FIGS. 10 to 20 show photoacoustic sensors 1000 to 2000, each of which can comprise a photoacoustic emitter unit and a photoacoustic detector unit. The emitter unit and detector unit can be realized here in each case by one of the MEMS devices described in association with previous figures.

Figure 10:
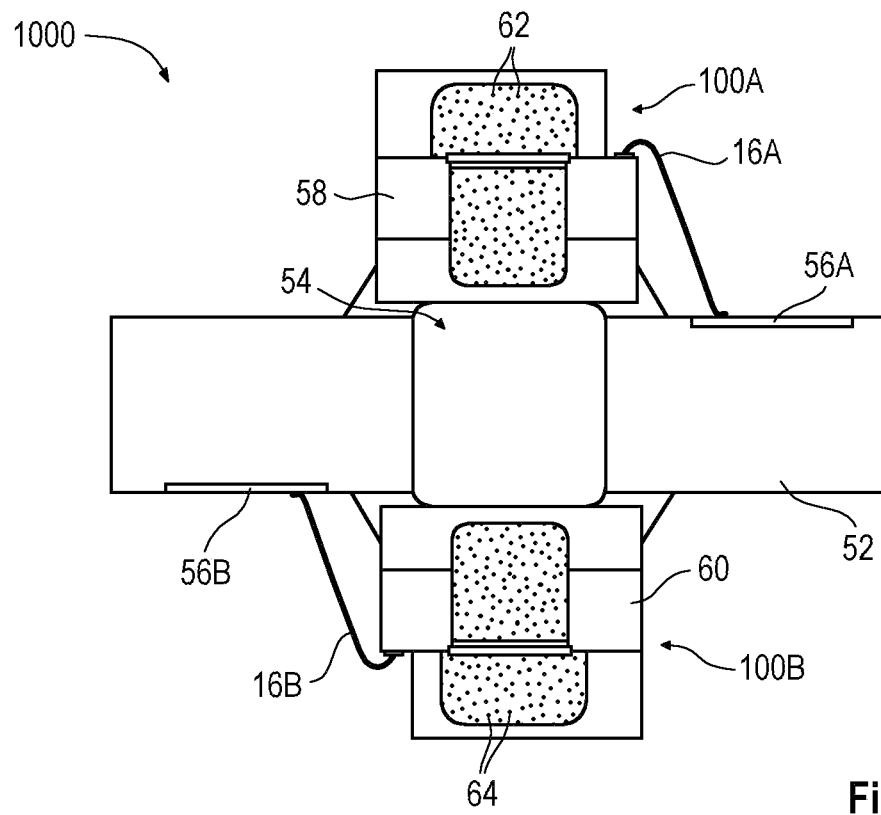
FIG. 10 schematically illustrates a cross-sectional side view of a photoacoustic sensor 1000 in accordance with the disclosure.

The photoacoustic sensor 1000 in FIG. 10 can comprise a substrate 52 having an opening 54. The substrate 52 can be for example a printed circuit board substrate or a ceramic substrate. The substrate 52 can have one or more electrical connections 56A and 56B on its top side and underside. A wiring structure (not illustrated) can be formed within the substrate 52, and can electrically connect the electrical connections 56A and 56B of the substrate 52 to one another in a suitable manner.

An (unpackaged) first MEMS device 100A can be arranged on the top side of the substrate 52 and over the opening 54. The first MEMS device 100A can be a photoacoustic emitter unit, which can comprise an emitter 58 in the form of a MEMS component. The cavities of the first MEMS device 100A can be filled by a protective gas 62. The first MEMS device 100A can be electrically connected to a first electrical connection 56A of the substrate 52 by way of a first electrical connection element 16A.

An (unpackaged) second MEMS device 100B can be arranged on the underside of the substrate 52 and over the opening 54. The second MEMS device 100B can be a photoacoustic detector unit, which can comprise a pressure detector 60 in the form of a MEMS component. The cavities of the second MEMS device 100B can be filled by a reference gas 64. The second MEMS device 100B can be electrically connected to a second electrical connection 56B of the substrate 52 by way of a second electrical connection element 16B.

The first MEMS device 100A or the emitter 58 can be a broadband emitter, which can be designed to emit optical radiation over a wide frequency range. In other words, the radiation emitted by the broadband emitter can comprise not just predetermined frequencies or predetermined frequency bands. The term "optical radiation" used in this description can generally refer to a partial range of the electromagnetic spectrum having wavelengths of between approximately 100 nm and approximately 100 µm. That is to say that the optical radiation can comprise, in particular, at least one from the following: ultraviolet (UV) radiation having a wavelength of approximately 100 nm to approximately 380 nm, infrared (IR) radiation having a wavelength of approximately 780 nm to approximately 100 µm, or radiation having a wavelength of approximately 780 nm to approximately 5 µm, i.e. near-infrared radiation and portions of mid-infrared radiation. The last-mentioned range can comprise, inter alia, the absorption lines/bands of carbon dioxide at 4.26 µm and of further gas species. Even more specifically, the optical radiation can have a wavelength of approximately 300 nm to approximately 20 µm (micrometers).

The first MEMS device 100A can be designed to emit optical pulses having a predetermined repetition frequency and one or more predetermined wavelengths. In this case, a predetermined wavelength can comprise an absorption band of a gas to be detected or of the reference gas 64. The repetition frequency of the optical pulses can be within a low-frequency range or within a frequency range of approximately 1 Hz to approximately 10 kHz, in particular of approximately 1 Hz to approximately 1 kHz. Even more specifically, a typical frequency range can be between approximately 1 Hz and approximately 100 Hz, corresponding to a pulse duration range of approximately 0.01 s to approximately 1 s.

A manner of functioning of the photoacoustic sensor 1000 is described below. The further photoacoustic sensors described herein can be operated in a similar manner.

The optical pulses emitted by the first MEMS device 100A can pass through the interspace formed by the opening 54, which interspace can be filled with ambient air, for example. During propagation through the opening 54, the optical pulses can be at least partly absorbed by portions of a gas to be detected if such a gas is present in the opening 54 (i.e. in the ambient air). The absorption can be specific to the gas to be detected, e.g. characteristic rotation or vibration modes of atoms or molecules of the gas to be detected.

The optical pulses can enter the cavity of the MEMS device 100B through the optically transparent material of the second MEMS device 100B and impinge there on atoms or molecules of the reference gas 64. In this case, the reference gas 64 can correspond to the gas to be detected. The optical pulses can at least partly be absorbed by the reference gas 64 and bring about local pressure increases in the reference gas 64. The pressure increases can be detected by the pressure detector 60 or a movable structure of the pressure detector 60. The signals detected by the pressure detector 60 can be logically processed by one or more circuits (not illustrated). By way of example, such signal processing can be carried out by an ASIC (Application Specific Integrated Circuit).

If no portions of the gas to be detected are present in the opening 54 or in the ambient air, the optical pulses emitted by the first MEMS device 100A are only absorbed by the reference gas 64 and the pressure detector 60 will detect a periodic measurement signal with the repetition frequency of the optical pulses and a first amplitude. If, in contrast thereto, portions of the gas to be detected are present in the opening 54, the optical radiation can additionally be absorbed by these portions. The pressure detector 60 will then output a periodic measurement signal with a second amplitude, which may be smaller than the first amplitude. A presence and/or a concentration of the gas to be detected in the ambient air can be determined on the basis of the magnitudes and profiles of the first and second amplitudes. If the concentration of the gas to be detected exceeds a predetermined threshold value, a signal, in particular a warning signal, can be output by the photoacoustic sensor 1000 or an apparatus connected thereto.

Figure 11:
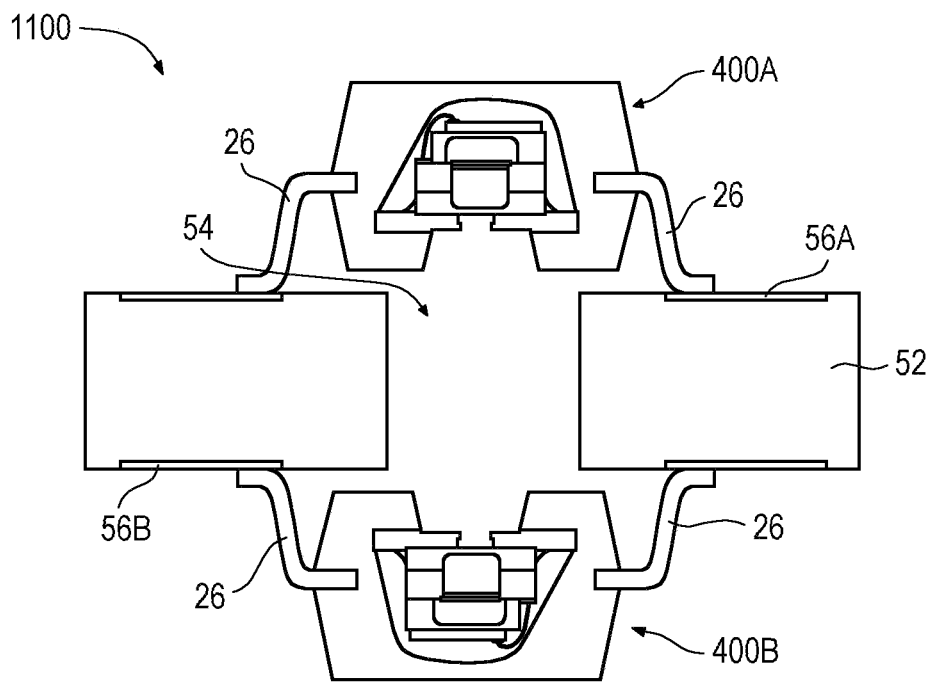
FIG. 11 schematically illustrates a cross-sectional side view of a photoacoustic sensor 1100 in accordance with the disclosure.

The photoacoustic sensor 1100 in FIG. 11 can be at least partly similar to the photoacoustic sensor 1000 in FIG. 10. In contrast to FIG. 10, the photoacoustic emitter unit and the photoacoustic detector unit can be present in the form of packaged MEMS devices 400A and 400B, each of which can be similar to the MEMS device 400 in FIG. 4.

Figure 12:
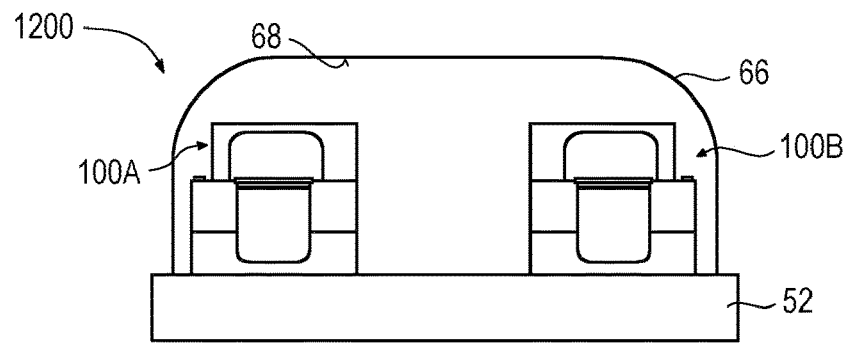
FIG. 12 schematically illustrates a cross-sectional side view of a photoacoustic sensor 1200 in accordance with the disclosure.

The photoacoustic sensor 1200 in FIG. 12 can comprise a substrate 52, which can be similar to the substrate 52 in FIG. 10, for example. Electrical connections and an internal wiring of the substrate 52 are not illustrated in FIG. 12 for the sake of simplicity. A first MEMS device 100A and a second MEMS device 100B can be arranged next to one another on the top side of the substrate 52. The MEMS devices 100A and 100B can each be similar to the MEMS device 100 in FIG. 1 and form a photoacoustic emitter unit and a photoacoustic detector unit. A cover 66 having an optically reflective inner surface 68 can be arranged over the MEMS devices 100A and 100B. In this case, the cover 66 can be secured to the substrate 52. Optical radiation emitted by the first MEMS device 100A can be reflected once or several times from the inner surface 68 of the cover 66 and can enter the cavity of the second MEMS device 100B.

Figure 13:
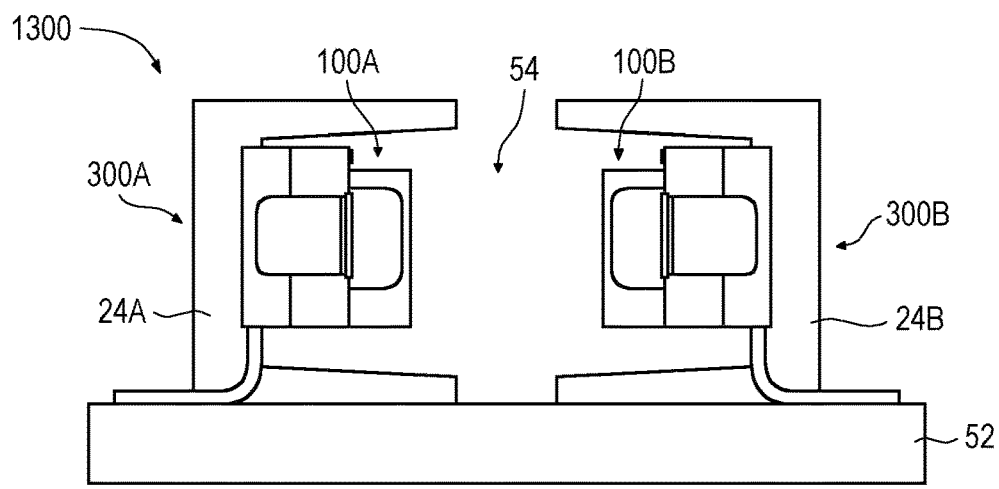
FIG. 13 schematically illustrates a cross-sectional side view of a photoacoustic sensor 1300 in accordance with the disclosure.

The photoacoustic sensor 1300 in FIG. 13 can comprise two MEMS devices 300A and 300B, each of which can be similar to the MEMS device 300 in FIG. 3. The MEMS devices 300A and 300B can be arranged next to one another on a substrate 52 in such a way that the openings of the shells 24A and 24B can face one another. As a result, optical radiation emitted by the first MEMS device 300A can pass through an interspace 54 with a gas to be detected possibly being present and can enter the cavity of the second MEMS device 300B. The MEMS devices 100A and 100B arranged in the shells 24A and 24B may or may not be encapsulated by an encapsulation material (not illustrated) such as a glob top material, for example.

Figure 14:
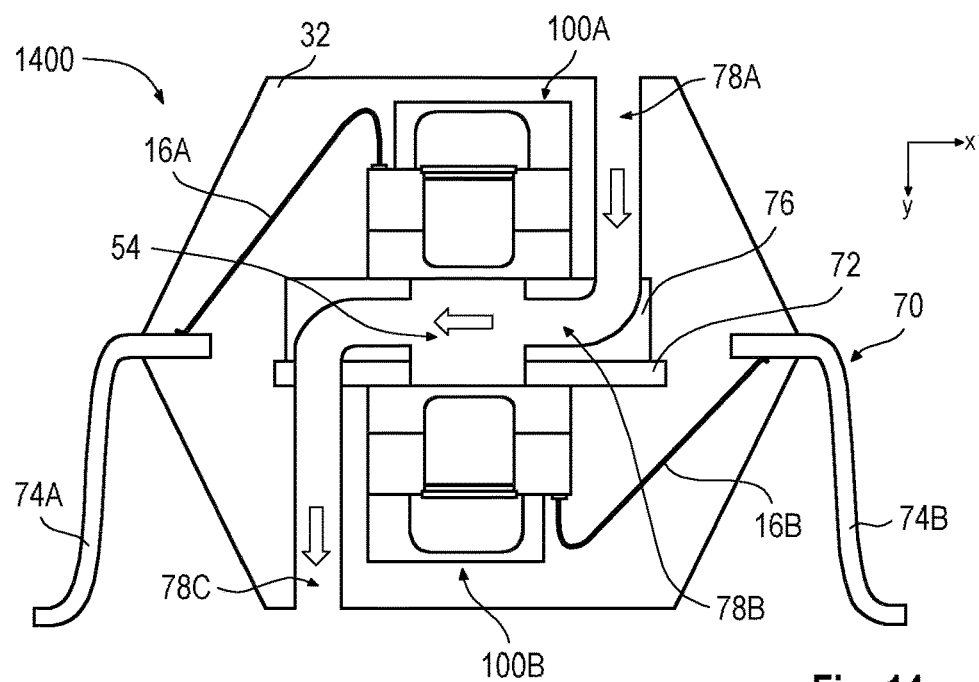
FIG. 14 schematically illustrates a cross-sectional side view of a photoacoustic sensor 1400 in accordance with the disclosure.

The photoacoustic sensor 1400 in FIG. 14 can comprise a leadframe 70 having a die pad 72 and one or more connecting conductors (or leads or pins) 74A and 74B. A carrier 76 can be arranged on the top side of the die pad 72, which carrier can be at least partly hollow. A first MEMS device 100A, which can have the functionality of a photoacoustic emitter unit, can be arranged on the top side of the die pad 72 or on the top side of the carrier 76. A second MEMS device 100B, which can have the functionality of a photoacoustic detector unit, can be arranged on the underside of the die pad 72. The leadframe 70, the carrier 76 and the MEMS devices 100A, 100B can be at least partly encapsulated by an encapsulation material 32, which can be fabricated from a mold compound, for example. The connecting conductors 74A and 74B can at least partly project from the encapsulation material 32 and make the MEMS devices 100A and 100B electrically accessible from outside the package by way of electrical connection elements 16A and 16B.

The photoacoustic sensor 1400 can comprise a gas channel 78, which can extend through the encapsulation material 32 and the carrier 76. In the example in FIG. 14, the gas channel 78 can have substantially three sections 78A to 78C. The first section 78A can extend in the y-direction substantially from the top side of the encapsulation material 32 as far as the top side of the carrier 76. The second section 78B can extend in the x-direction substantially parallel to the die pad 72 through the carrier 76 and can extend between the MEMS devices 100A and 100B. The third section 78C can extend in the y-direction substantially from the underside of the carrier 76 to the underside of the encapsulation material 32. The sections 78A to 78C of the gas channel 78 can merge continuously into one another. In the example in FIG. 14, the transitions between the sections 78A to 78C can have a rounded shape. In further examples, the transitions can have a different shape, for example angular, polygonal, etc. Ambient air can penetrate into the interior of the encapsulation material 32 through the gas channel 78. An exemplary path that can be taken by the ambient air through the encapsulation material 14 is indicated by arrows in FIG. 14.

The carrier 76 can have an opening on its top side, such that the underside of the first MEMS device 100A can be exposed. In a similar manner, the underside of the carrier 76 and the die pad 72 can have openings, such that the top side of the second MEMS device 100B can be exposed. The openings of the carrier 76 and of the die pad 72 and the second section 78B of the gas channel 78 can form an interspace 54 between the MEMS devices 100A and 100B. Optical radiation emitted by the first MEMS device 100A can propagate along an optical path in the y-direction through the interspace 54 to the second MEMS device 100B. In a similar manner, ambient air can pass through the gas channel 78 into the interspace 54 and thus into the optical path. In accordance with the principles of a photoacoustic sensor described above, the ambient air can be examined for possibly present portions of a gas to be detected.

Figure 15:
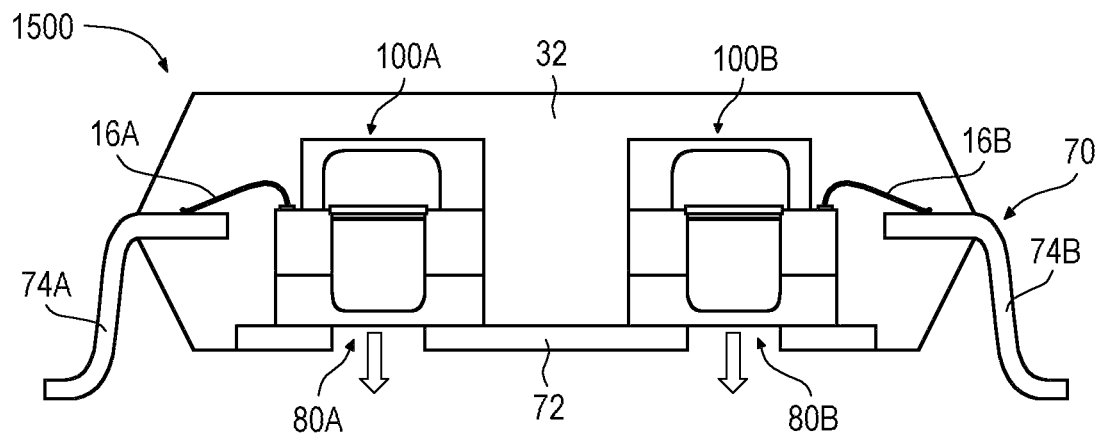
FIG. 15 schematically illustrates a cross-sectional side view of a photoacoustic sensor 1500 in accordance with the disclosure.

The photoacoustic sensor 1500 in FIG. 15 can comprise a leadframe 70 having a die pad 72 and connecting conductors 74A and 74B. Two MEMS devices 100A and 100B can be arranged on the die pad 72, which MEMS devices can form a photoacoustic emitter unit and a photoacoustic detector unit. The leadframe 70 and the MEMS devices 100A and 100B can be embedded in an encapsulation material 32. The die pad 72 can have openings 80A and 80B on its underside. In this case, the first opening 80A can be arranged below the first MEMS device 100A in such a way that the underside of the first MEMS device 100A can be exposed. In a similar manner, the second opening 80B can be arranged below the second MEMS device 100B in such a way that the underside of the second MEMS device 100B can be exposed.

During operation of the photoacoustic sensor 1500, the first MEMS device 100A can emit optical radiation through the first opening 80A. The optical radiation emitted can pass through ambient air, for example, which can be situated below the photoacoustic sensor 1500, for example. The optical radiation can be reflected at optically reflective structures (not illustrated) in such a way that it can enter the second MEMS device 100B through the second opening 80B.

Figure 16:
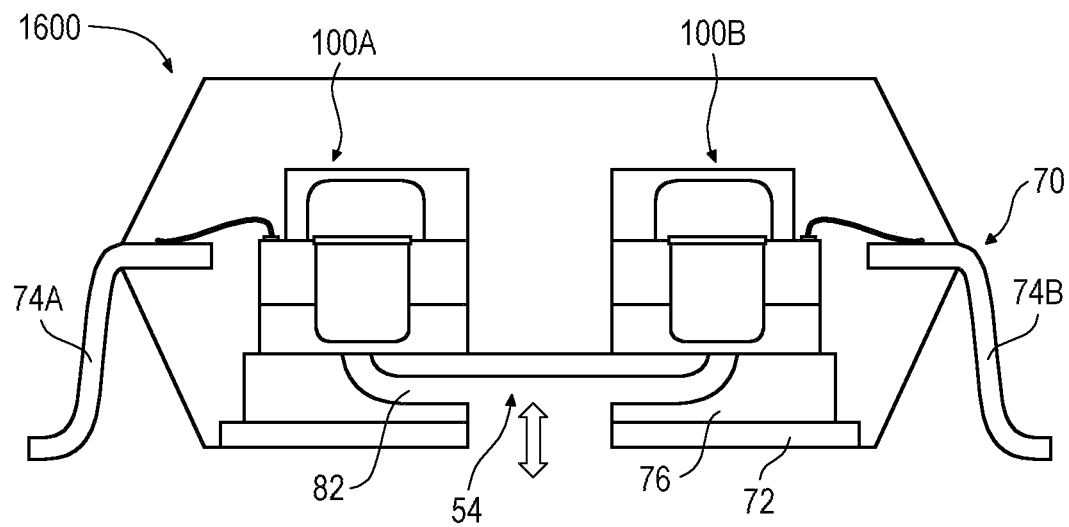
FIG. 16 schematically illustrates a cross-sectional side view of a photoacoustic sensor 1600 in accordance with the disclosure.

The photoacoustic sensor 1600 in FIG. 16 can be at least partly similar to the photoacoustic sensor 1500 in FIG. 15. In the example in FIG. 15, a carrier 76 can be arranged over the die pad 72. Through the carrier 76, an optical channel 82 can extend from the underside of the first MEMS device 100A as far as the underside of the second MEMS device 100B. Radiation emitted by the first MEMS device 100A can propagate through the optical channel 82 to the second MEMS device 100B. In one example, the optical channel 82 can be formed by a hollow channel having optically reflective inner surfaces. The die pad 72 and the carrier 76 can have openings, such that ambient air to be examined can pass into an interspace 54 or into the course of the optical channel 82.

Figure 17:
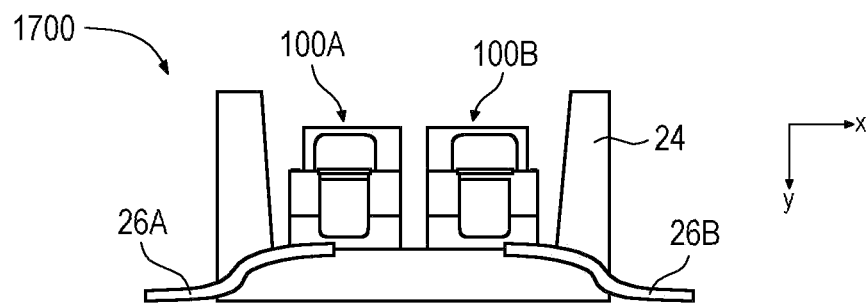
FIG. 17 schematically illustrates a cross-sectional side view of a photoacoustic sensor 1700 in accordance with the disclosure.

The photoacoustic sensor 1700 in FIG. 17 can comprise a shell 24, on the base surface of which a photoacoustic emitter unit and a photoacoustic detector unit in the form of two MEMS devices 100A and 100B can be arranged. The MEMS devices 100A and 100B can be electrically contacted from outside the shell 24 by way of connecting conductors 26A and 26B. During operation of the photoacoustic sensor 1700, the first MEMS device 100A can emit optical radiation, for example in the y-direction. The optical radiation emitted can pass through ambient air, for example, which can be situated above the photoacoustic sensor 1700, for example. The optical radiation can be reflected at optically reflective structures (not illustrated) such that it can enter the second MEMS device 100B.

Figure 18:
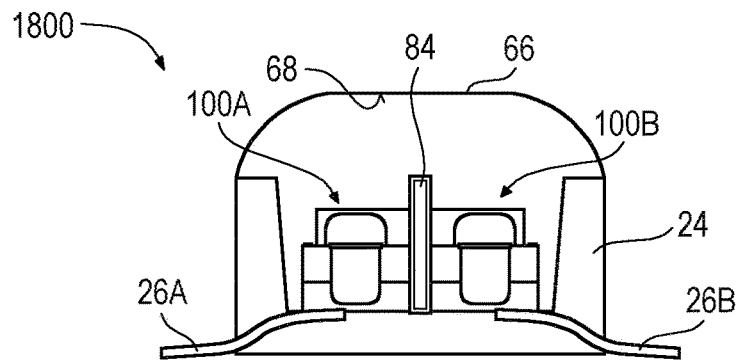
FIG. 18 schematically illustrates a cross-sectional side view of a photoacoustic sensor 1800 in accordance with the disclosure.

The photoacoustic sensor 1800 in FIG. 18 can be at least partly similar to the photoacoustic sensor 1700 in FIG. 17. In the example in FIG. 18, a separating structure 84 can be arranged between the MEMS devices 100A and 100B.

Furthermore, a cover 66 having an optically reflective inner surface 68 can be arranged over the MEMS devices 100A and 100B.

Figure 19:
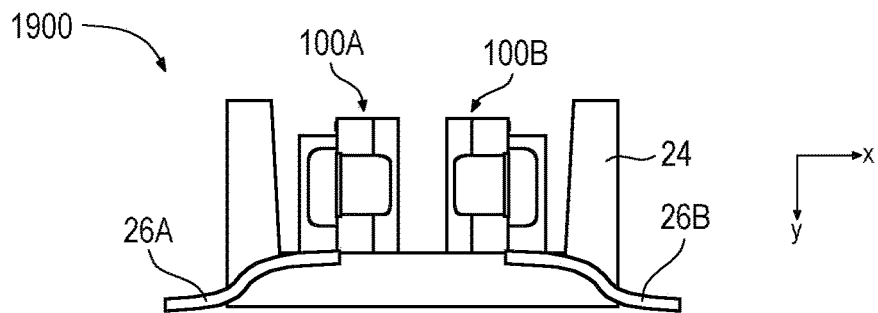
FIG. 19 schematically illustrates a cross-sectional side view of a photoacoustic sensor 1900 in accordance with the disclosure.

The photoacoustic sensor 1900 in FIG. 19 can be at least partly similar to the photoacoustic sensor 1700 in FIG. 17. In contrast to FIG. 17, the MEMS devices 100A and 100B can each be rotated by 90 degrees and be arranged on the base surface of the shell 24. During operation of the photoacoustic sensor 1900, the radiation emitted by the photoacoustic emitter can pass substantially in the x-direction, for example.

Figure 20:
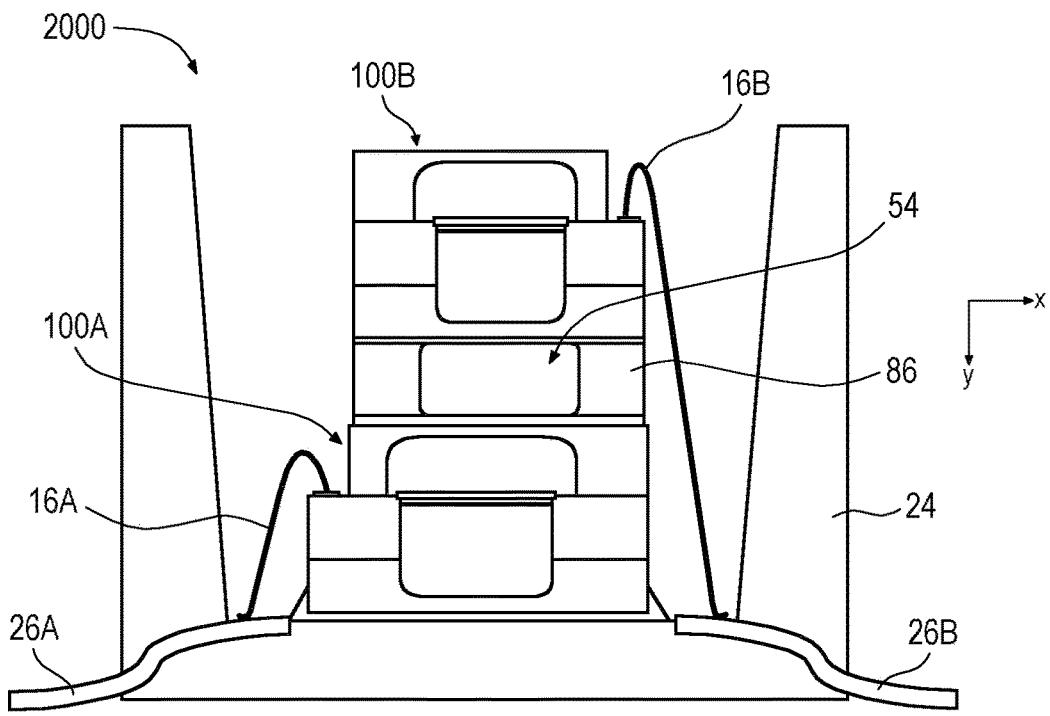
FIG. 20 schematically illustrates a cross-sectional side view of a photoacoustic sensor 2000 in accordance with the disclosure.

In the example in FIG. 20, the MEMS devices 100A and 100B can be arranged in a manner stacked one above the other on the base surface of the shell 24. One or more spacers 86 can be arranged between the MEMS devices 100A and 100B, as a result of which an interspace 54 arranged between the MEMS devices 100A and 100B can be formed. During operation of the photoacoustic sensor 2000, ambient air situated in the interspace 54, for example, can be examined for portions of a gas to be detected. In this case, optical pulses emitted by the first MEMS device 100A can pass through the interspace 54 in the y-direction.

Figure 21:
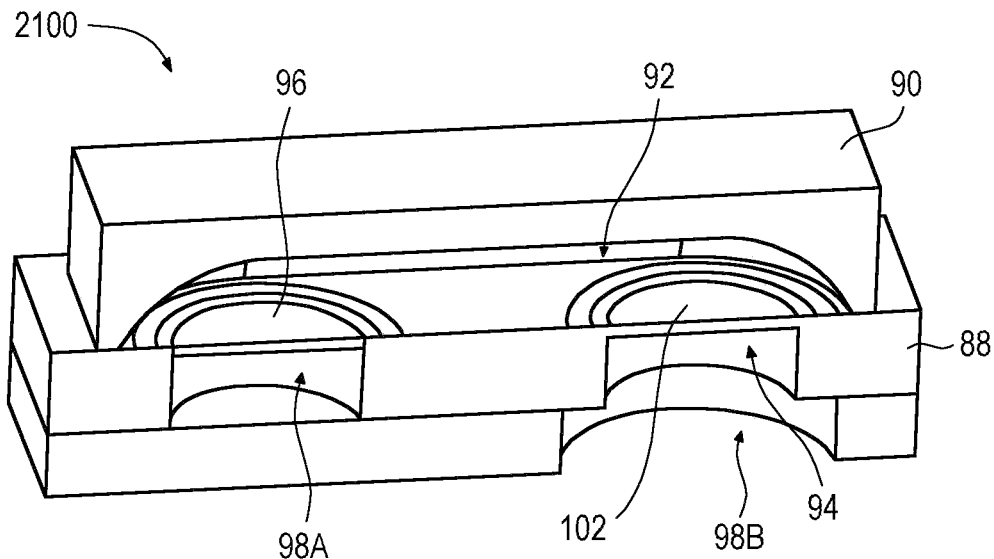
FIG. 21 schematically illustrates a perspective cross-sectional view of a MEMS device 2100 in accordance with the disclosure.

The MEMS device 2100 in FIG. 21 can comprise a MEMS component 88 and a cover 90 secured to the MEMS component 88. In this case, the MEMS component 88 and the cover 90 can form a closed cavity 92. The MEMS component 88 can have an optical opening 94, which provides an optical access to the cavity 92 and to an optical path extending within the cavity 92. A movable part or a movable structure 96 of the MEMS component 88 can be arranged outside the course of the optical path.

The MEMS component 88 can be a MEMS chip, for example, which can be fabricated from a semiconductor material such as silicon, for example. The movable part 96 of the MEMS component 88 can be formed from a semiconductor material of the MEMS component 88. In the example in FIG. 21, the movable part 96 can form a membrane of a pressure detector. In this case, the MEMS device 2100 can form for example a photoacoustic detector unit of a photoacoustic sensor. Below the movable part 96, a first depression 98A can be arranged in a semiconductor material of the MEMS component 88. An (in particular acoustically tight) cavity can be formed by the first depression 98A.

The optical opening 94 can be arranged in particular in the underside of the MEMS component 88. In the example in FIG. 21, the optical opening 94 can be formed by or comprise a barrier layer 102. The barrier layer 102 can be fabricated from a semiconductor material of the MEMS component 88, for example. The optical opening 94 or the barrier layer 102 can be transparent to optical radiation, on the one hand. On the other hand, the optical opening 94 or the barrier layer 102 can be impermeable to a gas arranged in the cavity 92, in particular a reference gas.

Below the optical opening 94, a second depression 98B can be arranged in a semiconductor material of the MEMS component 88. The depressions 98A and 98B may have been produced by identical method steps and have a substantially identical geometric shape. In one example, the first depression 98A can be fabricated by an etching method in a semiconductor material of the MEMS component 88. In further process steps, the movable part 96 of the MEMS component 88 can be structured further in order to form a membrane of a pressure detector, for example. The second depression 98B can be fabricated in parallel with the etching step described. In this case, the further process steps for forming the movable part 96 can be dispensed with, such that only the thin barrier layer 102 comprised of a semiconductor material can remain. The barrier layer 102 or the optical opening 94 can thus be regarded as an incompletely produced pressure detector or "half pressure detector". On account of the parallel production described, the optical opening 94 or the barrier layer 102 and the movable part 96 of the MEMS component 88 can lie substantially in an identical plane. In this case, the plane can in particular correspond to the top side of the MEMS component 88 or extend parallel thereto.

The cover 90 can be secured to the top side of the MEMS component 88, such that the MEMS component 88 and the cover 90 can form the closed cavity 92. In this case, the cover 90 may have been secured to the MEMS component 88 by means of a wafer bonding technique, in particular. The cover 90 can be fabricated from a glass material or a semiconductor material, for example. The inner surface of the cover 90 can be optically reflective or have optically reflective structures.

In one example, the MEMS device 2100 can be operated in particular as a photoacoustic detector unit. During operation, radiation emitted by an optical emitter (not illustrated) can enter the cavity 92 through the optical opening 94 or the barrier layer 102. The optical radiation may previously have passed through ambient air, for example, which is intended to be examined for portions of a gas to be detected. The optical radiation can be at least partly absorbed by a reference gas enclosed in the cavity 92. In this case, the optical radiation can be reflected at the inner surface of the cover 90 in such a way that it can pass at least partly parallel to the top side of the MEMS component 88 after reflection within the cavity 92. On account of such a parallel course, a lengthened absorption path can be provided in comparison with conventional photoacoustic detector units. The optical radiation can be at least partly absorbed by the reference gas and bring about local pressure increases in the reference gas. The pressure increases in the reference gas can be detected by the movable part 96. The detected signals can be logically processed for example by an ASIC (not illustrated).

In contrast to conventional photoacoustic detector units, in the example in FIG. 21 the movable part 96 can be arranged such that it lies outside a course of the optical radiation, i.e. outside the optical path. Consequently, since the optical radiation does not impinge on a surface of the movable part 96, corruption of the signals detected by the movable part 96 can be avoided or at least reduced.

Figure 22:
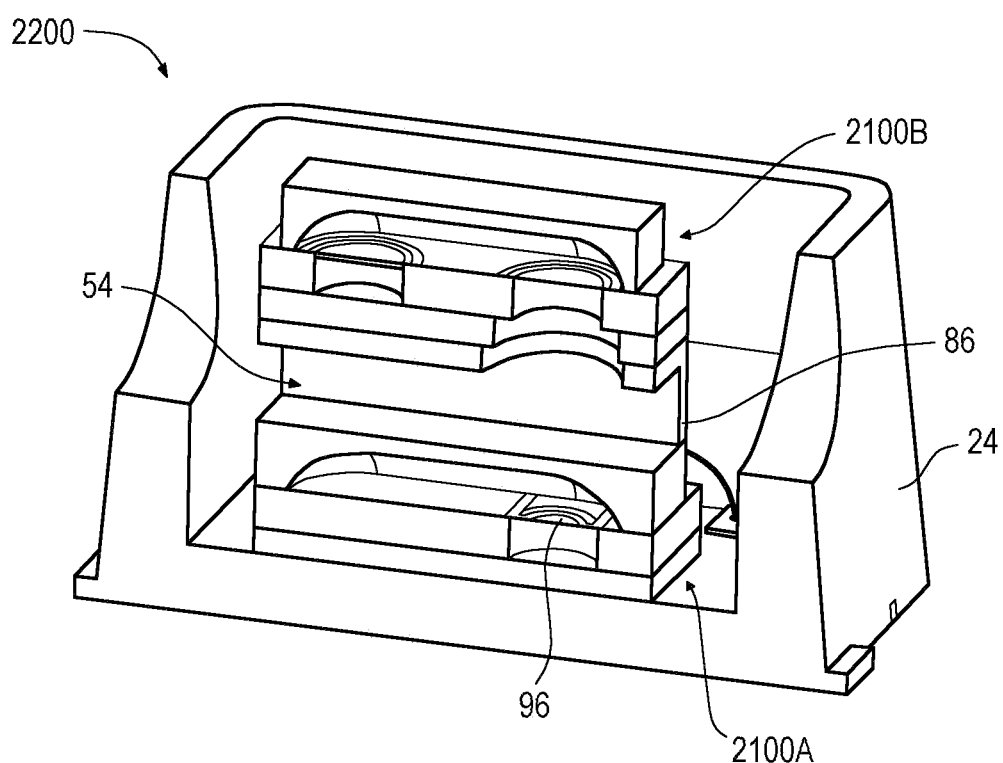
FIG. 22 schematically illustrates a perspective cross-sectional view of a photoacoustic sensor 2200 in accordance with the disclosure.
Figure 23:
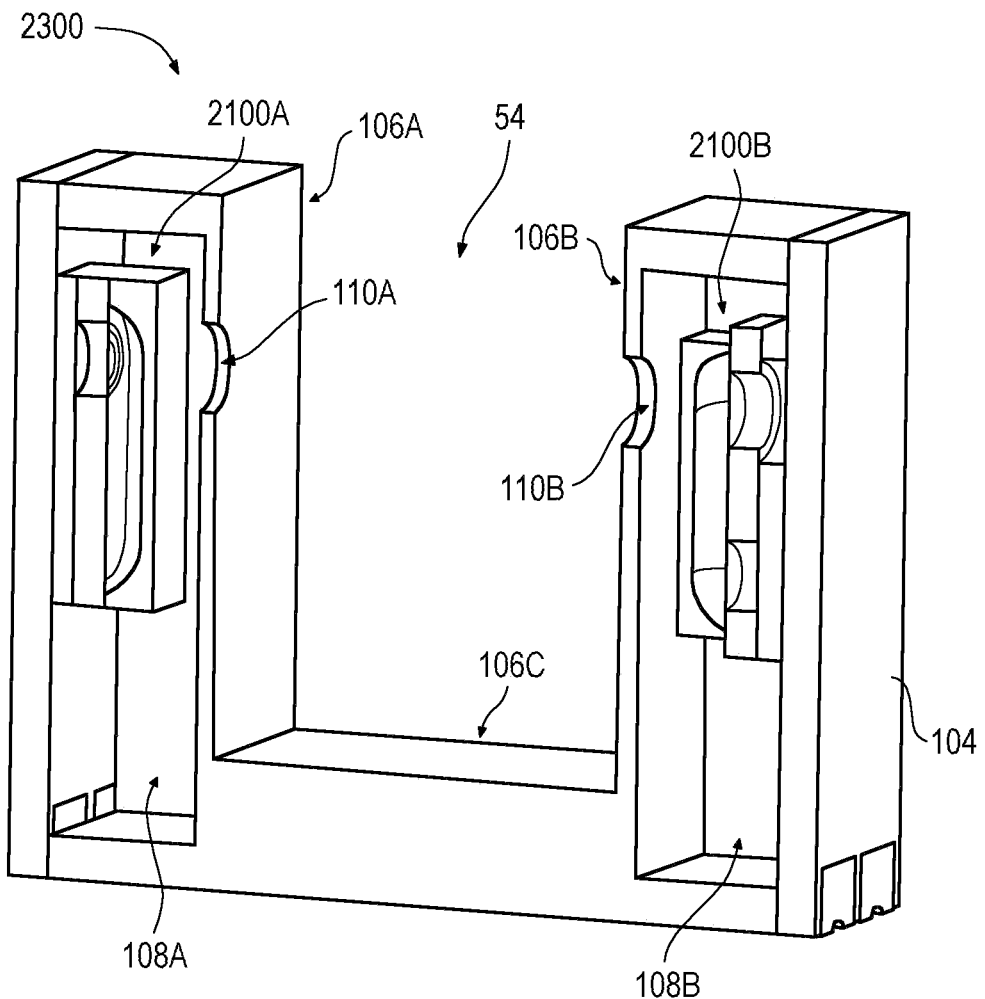
FIG. 23 schematically illustrates a perspective cross-sectional view of a photoacoustic sensor 2300 in accordance with the disclosure.

FIGS. 22 and 23 show photoacoustic sensors 2200 and 2300, each of which can comprise a photoacoustic emitter unit and a photoacoustic detector unit. The emitter unit and detector unit can be realized in each case by a MEMS device which can be similar to the MEMS device 2100 in FIG. 21. In further examples, the MEMS devices 2100 can also be combined to form a photoacoustic sensor in accordance with any of FIGS. 10 to 20.

The photoacoustic sensor 2200 in FIG. 22 can be at least partly similar to the photoacoustic sensor 2000 in FIG. 20 and be operated in a similar manner. Two MEMS devices 2100A and 2100B stacked one above the other can be arranged on the base surface of a shell 24, which MEMS devices can be spaced apart from one another by one or more spacers 86. The lower MEMS device 2100A can have the function of a photoacoustic emitter unit. In this case, a movable part 96 of the MEMS device 2100A can form a heating memory, for example, which can be designed to emit optical radiation. The upper MEMS device 2100B can have the function of a photoacoustic detector unit and can be similar to the MEMS device 2100 in FIG. 21.

The photoacoustic sensor 2300 in FIG. 23 can comprise a housing 104, which can be embodied in a U-shaped fashion, for example. In the example in FIG. 23, the housing 104 can have two substantially vertical sections 106A and 106B, which can be connected by a substantially horizontal section 106C. The vertical housing sections 106A and 106B can have cavities 108A and 108B. A first MEMS device 2100A, which can be embodied as a photoacoustic emitter unit, can be arranged in the first cavity 108A. A second MEMS device 2100B, which can be embodied as a photoacoustic detector unit, can be arranged in the second cavity 108B.

The vertical housing sections 106A and 106B can have openings 110A and 110B, which can be arranged at an identical height and can face one another. The MEMS devices 2100A and 2100B can be arranged in an analogous manner such that their main surfaces can face one another. During operation of the photoacoustic sensor 2300, optical radiation emitted by the first MEMS device 2100A can pass through the opening 110A and an interspace 54 situated between the vertical housing sections 106A and 106B. In the interspace 54, the optical radiation can be absorbed by a gas to be detected possibly being present there and can enter the second MEMS device 2100B through the second opening 10B.

EXAMPLES

Photoacoustic sensors and MEMS devices are explained below on the basis of examples.

Example 1 is a photoacoustic sensor, comprising:
a first MEMS device, comprising: a first MEMS component comprising an optical emitter, and a first optically transparent cover wafer-bonded to the first MEMS component, wherein the first MEMS component and the first optically transparent cover form a first closed cavity; and a second MEMS device, comprising: a second MEMS component comprising a pressure detector, and a second optically transparent cover wafer-bonded to the second MEMS component, wherein the second MEMS component and the second optically transparent cover form a second closed cavity Example 2 is a photoacoustic sensor according to example 1, wherein the first MEMS device further comprises: a third cover wafer-bonded to the first MEMS component, wherein the first MEMS component and the third cover form a third closed cavity, wherein the first cavity and the third cavity are arranged on opposite sides of a movable structure of the first MEMS component.

Example 3 is a photoacoustic sensor according to example 1, wherein the first MEMS device further comprises: a carrier, wherein the first cover is wafer-bonded to the carrier, wherein the first cavity is arranged between the first cover and a movable structure of the first MEMS component, and wherein a third cavity is arranged between the carrier and the movable structure.

Example 4 is a photoacoustic sensor according to any of the preceding examples, furthermore comprising: a substrate, wherein the first MEMS device and the second MEMS device are arranged next to one another on a same surface of the substrate.

Example 5 is a photoacoustic sensor according to example 4, furthermore comprising: a cover arranged above the MEMS devices arranged next to one another, said cover having an optically reflective inner surface.

Example 6 is a photoacoustic sensor according to any of examples 1 to 3, furthermore comprising: a substrate, wherein the first MEMS device and the second MEMS device are arranged on opposite surfaces of the substrate and over an opening formed in the substrate.

Example 7 is a photoacoustic sensor according to any of examples 1 to 3, furthermore comprising: an encapsulation material, wherein the first MEMS device and the second MEMS device are encapsulated by the encapsulation material.

Example 8 is a photoacoustic sensor according to example 7, furthermore comprising: a gas channel extending within the encapsulation material between the first MEMS device and the second MEMS device.

Example 9 is a photoacoustic sensor according to example 7 or 8, furthermore comprising: an optical path extending within the encapsulation material from the first MEMS device to the second MEMS device.

Example 10 is a photoacoustic sensor according to example 9, furthermore comprising: a leadframe, wherein the first MEMS device and the second MEMS device are arranged on opposite surfaces of the leadframe, wherein the gas channel extends at least partly parallel to the surfaces of the leadframe, and wherein the optical path extends at least partly perpendicularly to the surfaces of the leadframe.

Example 11 is a photoacoustic sensor according to example 9, furthermore comprising: leadframe, wherein the first MEMS device and the second MEMS device are arranged on a same surface of the leadframe, wherein the optical path extends at least partly parallel to the surface of the leadframe.

Example 12 is a photoacoustic sensor according to any of examples 1 to 3, furthermore comprising: a shell, wherein the first MEMS device and the second MEMS device are arranged next to one another on a base of the shell.

Example 13 is a photoacoustic sensor according to any of examples 1 to 3, furthermore comprising: a shell, wherein the first MEMS device and the second MEMS device are arranged in a manner stacked one above the other on a base of the shell and a spacer is arranged between the MEMS devices stacked one above the other.

Example 14 is a MEMS device, comprising: a MEMS component; a cover secured to the MEMS component, wherein the MEMS component and the cover form a closed cavity; and an optical opening, which provides an optical access to the cavity and to an optical path extending within the cavity, wherein a movable part of the MEMS component is arranged outside the course of the optical path.

Example 15 is a MEMS device according to example 14, wherein the optical opening and the movable part of the MEMS component lie substantially in a same plane.

Example 16 is a MEMS device according to example 14 or 15, wherein the optical opening comprises a barrier layer formed by a semiconductor material of the MEMS component.

Example 17 is a MEMS device according to any of examples 14 to 16, wherein the optical opening is impermeable to a gas arranged in the cavity.

Example 18 is a MEMS device according to any of examples 14 to 17, wherein the cover is produced from a glass material and is secured to a semiconductor material of the MEMS component.

Example 19 is a MEMS device according to example 18, wherein the glass material of the cover is wafer-bonded to the semiconductor material of the MEMS component.

Example 20 is a MEMS device according to any of examples 14 to 19, wherein: the cover is arranged over a first surface of the MEMS component, and the optical opening is formed in a second surface of the MEMS component situated opposite the first surface.

Example 21 is a MEMS device according to example 20, wherein the optical path extends within the cavity at least partly parallel to the first surface of the MEMS component.

Example 22 is a MEMS device according to any of examples 14 to 21, furthermore comprising: a first depression formed in a semiconductor material of the MEMS component, said first depression being arranged below the movable part of the MEMS component; a second depression formed in a semiconductor material of the MEMS component, said second depression being arranged below the optical opening, wherein the first depression and the second depression have a substantially identical geometric shape.

Example 23 is a MEMS device according to any of examples 14 to 22, wherein the MEMS component comprises a pressure detector.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A MEMS device, comprising:
    a MEMS component comprising:
        a first surface;
        a second surface situated opposite to the first surface;
        a barrier layer arranged at the first surface, the barrier layer being transparent to optical radiation and impermeable to a reference gas; and
        a movable part arranged at the first surface;
    a cover secured to the first surface of the MEMS component,
        wherein the MEMS component and the cover form a closed cavity over the first surface of the MEMS component, and
        wherein the barrier layer and the movable part are arranged at a boundary of the closed cavity and are exposed to the reference gas, which is contained in the closed cavity; and
    an optical opening that extends from the second surface of the MEMS component to the barrier layer, wherein the optical opening provides an optical access to the closed cavity and to an optical path extending within the closed cavity,
    wherein the movable part of the MEMS component is arranged outside a course of the optical path.

2. The MEMS device as claimed in claim 1, wherein the optical opening and the movable part of the MEMS component lie substantially in an identical plane.

3. The MEMS device as claimed in claim 1, wherein the cover is produced from a glass material and is secured to a semiconductor material of the MEMS component.

4. The MEMS device as claimed in claim 3, wherein the glass material of the cover is wafer-bonded to the semiconductor material of the MEMS component.

5. The MEMS device as claimed in claim 1, wherein the optical path extends within the closed cavity at least partly parallel to the first surface of the MEMS component.

6. The MEMS device as claimed in claim 1, further comprising:
    a first depression formed in a semiconductor material of the MEMS component, the first depression being arranged below the movable part of the MEMS component, and the movable part being arranged between the closed cavity and the first depression; and
    a second depression formed in the semiconductor material of the MEMS component, the second depression being arranged below the barrier layer, the second depression defining a portion of the optical opening.

7. The MEMS device as claimed in claim 1, wherein the MEMS component comprises a pressure detector formed, in part, by the movable part.

8. The MEMS device as claimed in claim 1, wherein the cover is a transparent cover.

9. The MEMS device as claimed in claim 1, wherein the cover is wafer-bonded to the MEMS component.

10. The MEMS device as claimed in claim 1, wherein the cover is a first cover,
    wherein the closed cavity is a first closed cavity, and
    wherein the MEMS device further comprises:
        a second cover that forms a second closed cavity with the MEMS component.

11. The MEMS device as claimed in claim 10, wherein the second cover is optically transparent.

12. A photoacoustic detector device, comprising:
    a MEMS component comprising:
        a first surface;
        a second surface situated opposite to the first surface;
        a barrier layer, the barrier layer being transparent to optical radiation and impermeable to a gas; and
        a movable membrane;
    a cover,
        wherein the MEMS component and the cover form a cavity over the first surface of the MEMS component,
        wherein the barrier layer and the movable membrane are coupled to the cavity; and
    an opening that is configured to provide, via the barrier layer, an optical access to the cavity and to an optical path within the cavity,
        wherein the movable membrane of the MEMS component is arranged outside the optical path.

13. The MEMS device as claimed in claim 1, wherein the MEMS component is a MEMS chip fabricated from a semiconductor material, and
    wherein the barrier layer and the movable part are formed from the semiconductor material.

14. The MEMS device as claimed in claim 6, wherein the first depression and the second depression have a substantially identical geometric shape.

15. The MEMS device as claimed in claim 1, wherein an inner surface of the cover, arranged within the closed cavity, is optically reflective or has optically reflective structures.

16. The MEMS device as claimed in claim 1, wherein the movable part of the MEMS component is arranged outside the course of the optical path such that the optical radiation does not impinge on a surface of the movable part.

17. The photoacoustic detector device as claimed in claim 12, wherein the opening extends from the second surface of the MEMS component to the barrier layer, and
    wherein the opening is configured to provide the optical access, to the cavity, for the optical radiation such that the optical radiation propagates along the optical path.

18. The photoacoustic detector device as claimed in claim 12, wherein the opening and the movable membrane of the MEMS component lie substantially in an identical plane.

19. The photoacoustic detector device as claimed in claim 12, further comprising:
- a first depression formed in a semiconductor material of the MEMS component, the first depression being arranged below the movable membrane of the MEMS component, and the movable membrane being arranged between the cavity and the first depression; and
- a second depression formed in the semiconductor material of the MEMS component, the second depression being arranged below the barrier layer, the second depression defining a portion of the opening.

20. The photoacoustic detector device as claimed in claim 12, wherein the cavity is a closed cavity that contains a reference gas as the gas.

* * * * *